(12) United States Patent
Murden et al.

(10) Patent No.: US 6,172,636 B1
(45) Date of Patent: Jan. 9, 2001

(54) LINEARIZING STRUCTURES AND METHODS FOR ADJUSTABLE-GAIN FOLDING AMPLIFIERS

(75) Inventors: Frank Murden; Michael R. Elliott, both of Greensboro, NC (US)

(73) Assignee: Analog Devices, Inc., Norwood, MA (US)

( * ) Notice: Under 35 U.S.C. 154(b), the term of this patent shall be extended for 0 days.

(21) Appl. No.: 09/352,828

(22) Filed: Jul. 13, 1999

(51) Int. Cl.[7] ............................... H03M 1/12; G06G 7/12
(52) U.S. Cl. ................... 341/155; 341/155; 341/156; 341/158; 341/159; 327/563; 330/252
(58) Field of Search .................... 341/155, 156, 341/158, 159, 161; 327/563; 330/252

(56) References Cited

U.S. PATENT DOCUMENTS

| | | | |
|---|---|---|---|
| 5,376,937 | * 12/1994 | Colleran et al. | 341/159 |
| 5,392,045 | * 2/1995 | Yee | 341/156 |
| 5,455,584 | 10/1995 | Taddiken | 341/200 |
| 5,530,444 | * 6/1996 | Tice et al. | 341/156 |
| 5,550,492 | 8/1996 | Murden et al. | 327/65 |
| 5,684,419 | 11/1997 | Murden et al. | 327/104 |
| 5,719,578 | 2/1998 | Bolune | 341/161 |
| 5,835,047 | 11/1998 | Vorenkamp et al. | 341/156 |
| 5,990,820 | * 11/1999 | Tan | 341/161 |
| 6,069,579 | * 5/2000 | Ito et al. | 341/156 |

OTHER PUBLICATIONS

Kester, Walt, et al., *High Speed Design Techniques*, Analog Devices, Inc., Norwood, MA., 1996, pp. 4–36 to 4–47.

* cited by examiner

*Primary Examiner*—Michael Tokar
*Assistant Examiner*—Vibol Tan
(74) *Attorney, Agent, or Firm*—Koppel & Jacobs (57) ABSTRACT

Structures and methods are provided that linearize and stabilize the gain of adjustable-gain folding amplifiers. Accordingly, these folding amplifiers are suited for use in various compound ADCs where they improve the performance of subsequent folding amplifier stages, increase the number of allowed subsequent stages and replace the functions of other portions of compound ADCs (e.g., subranging ADCs).

21 Claims, 6 Drawing Sheets

LINEARIZING STRUCTURES AND METHODS FOR ADJUSTABLE-GAIN FOLDING AMPLIFIERS

BACKGROUND OF THE INVENTION

1. Field of the Invention

The present invention relates generally to analog-to-digital converters (ADCs) and more particularly to folding amplifiers.

2. Description of the Related Art

Single-bit ADCs quantize an analog input signal to a digital output signal that consists of one binary bit. Although useful in themselves, they also serve as building blocks for constructing more complex ADC structures (e.g., serial ADCs and subranging ADCs) in which they are typically positioned in a serial arrangement of ADC stages. The terminal ADC in such an arrangement can generally be a simple comparator but preceding stages must process an input analog signal and pass it to successive stages for further quantization.

An exemplary preceding single-bit stage comprises an amplifier, a subtracter and a comparator that drives a single-bit digital-to-analog converter (DAC) in the form of a switch. The amplifier and the comparator are coupled to the analog input signal and the output of the single-bit DAC is subtracted from the amplifier's output to produce an analog residue signal that is passed to a successive ADC stage.

For one polarity of the input signal, the residue signal equals the amplified input signal less a first analog signal (e.g., a voltage at the upper end of the input signal range) from the DAC. For the other polarity of the input signal, the residue signal equals the amplified input signal less a second analog signal (e.g., a voltage at the lower end of the input signal range) from the DAC.

Accordingly, the residue signal contains two linear regions separated by a discontinuity that occurs at the input signal's polarity transition and equals the difference between the first and second analog signals. In order to maintain a constant signal range between the input and output, the gain of the amplifier is typically configured with a gain of two. Successful operation of a serial arrangement of these single-bit stages, however, is significantly degraded by transients that are generated by each stage's discontinuity.

The discontinuity is avoided by substitution of folding amplifiers which have a positive gain for one polarity of input signal and a negative gain for the other polarity with the output signal generally level-shifted to facilitate signal quantization in a successive folding amplifier. Folding amplifiers have typically been designed in unity-gain and adjustable-gain configurations.

An exemplary adjustable-gain folding amplifier is disclosed in U.S. Pat. No. 5,684,419 issued Nov. 4, 1997 to Frank Murden, et al., and assigned to Analog Devices, Inc., the assignee of the present invention. This amplifier includes first and second differential pairs of transistors that have control terminals complimentarily and differentially coupled to an input differential pair and associated degeneration input resistor and that have current terminals cross-coupled to generate output signals across output resistors. The signal gain can be adjusted by appropriate selection of input and output resistors.

Although adjustable-gain folding amplifiers are generally slower, more complex and less efficient than unity-gain folding amplifiers (e.g., as exemplified by U.S. Pat. No. 5,550,492 issued Aug. 27, 1996 to Frank Murden and assigned to Analog Devices, Inc.), they are especially suited for use as one or more initial stages in N-stage serial ADC arrangements. In these initial stages, their signal gain insures that the input signal range of successive unity-gain folding amplifiers remains above a level that is considered adequate for reliable quantization. This reliability, however, is degraded by any nonlinearity in the transfer functions of the initial stages.

Although presently available adjustable-gain folding amplifiers can be configured to realize various signal gains, they typically exhibit signal nonlinearities that limit the number N of subsequent serially-arranged ADC stages. Because they also typically exhibit gain variations from production unit to unit that can also degrade the performance of subsequent ADC stages, their adjustable gains have generally been limited to small values (e.g., a gain of 2).

SUMMARY OF THE INVENTION

The present invention is directed to linearizing structures and methods for adjustable-gain folding amplifiers. Because these structures and methods linearize and stabilize their gain, adjustable-gain folding amplifiers of the invention improve the performance of subsequent folding amplifier stages, increase the number of allowed subsequent stages and replace the functions of other portions of compound ADCs (e.g., subranging ADCs).

These goals are achieved with the following process steps that generate a folded and level-shifted differential output voltage in linear response to a differential input voltage:

a) with circuit components that include active components, converting the differential input voltage to a signal current;

b) diverting substantially all of the signal current from the active components to flow differentially through first and second current paths;

c) steering currents on the first and second current paths to third and fourth current paths respectively when the input signal has one polarity and to the fourth and third current paths respectively when the input signal has a different polarity;

d) converting currents on the third and fourth current paths to a differential signal voltage; and e) shifting voltage levels of the differential signal voltage to thereby generate the differential output voltage.

In a method embodiment, the diverting step includes the steps of receiving differential currents from the active components, amplifying the differential currents with a current gain to realize amplified differential currents, and directing the amplified differential currents differentially along the first and second current paths.

In a structural embodiment, the active components include an input differential pair of transistors, the circuit components also include a resistor coupled between the first current terminals of the input differential pair, and a current-feedback circuit receives a differential sense current from second current terminals of the input differential pair, amplifies the differential sense current to a differential feedback current and couples the differential feedback current to the first current terminals of the input pair.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
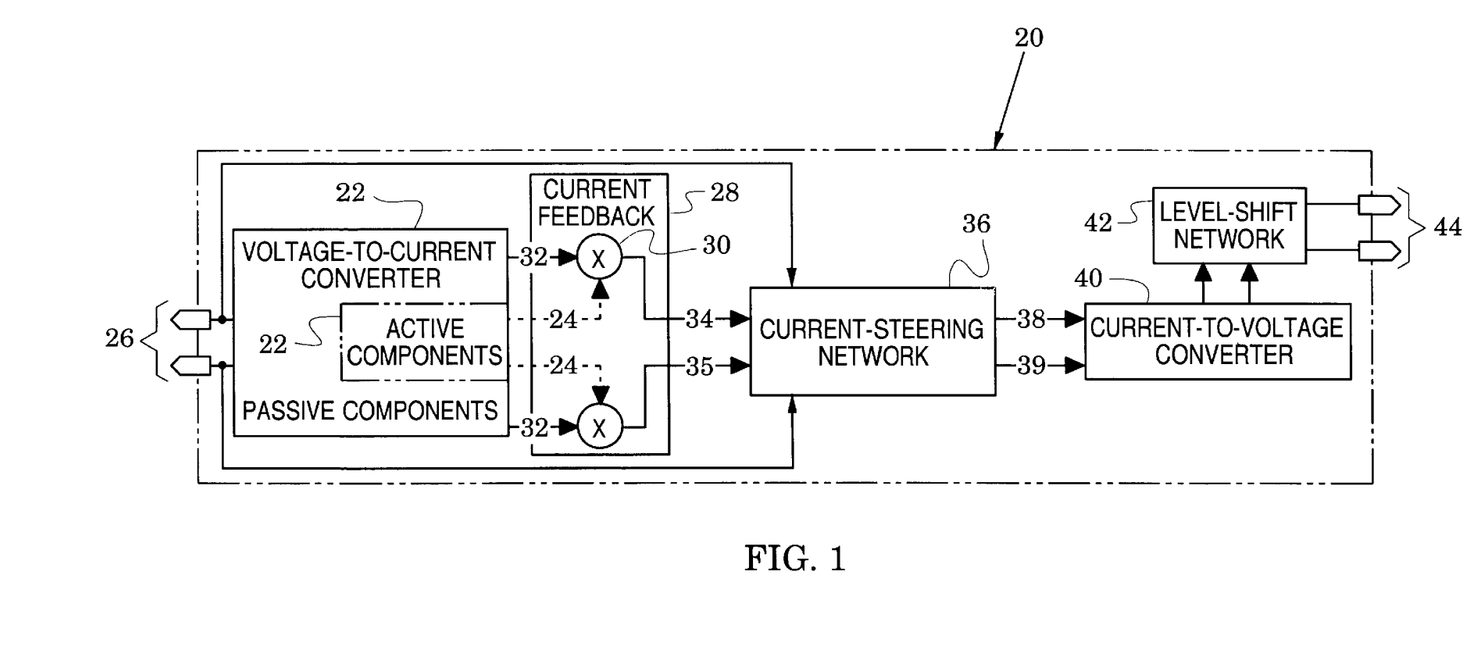
FIG. 1 is a block diagram of a linear adjustable-gain folding amplifier of the Present invention.

FIG. 1 illustrates a folding amplifier 20 that generates a folded and level-shifted differential output voltage in linear response to a differential input voltage. Because the enhanced transfer-function linearity of this folding amplifier reduces errors in downstream ADC stages, it is particularly useful in forming various compound ADC structures (e.g., serial and subranging ADCs). Because of its enhanced gain stability, its gain be reliably increased where needed to simplify and enhance these ADC structures.

In particular, a voltage-to-current converter 22 generates differential currents 24 in response to the differential input voltage at a differential input port 26. A current-feedback circuit 28 receives the differential currents 24 and applies them to current multipliers 30 to generate differential signal currents 32 that flow from passive components of the voltage-to-current converter 22 to current paths 34 and 35.

A current-steering network 36 responds to the differential input voltage and steers currents on the current paths 34 and 35 to flow respectively along current paths 38 and 39 when the input signal has one polarity and to flow respectively along current paths 39 and 38 when the input signal has another polarity.

In response to currents on the current paths 38 and 39, a current-to-voltage converter 40 generates a differential signal voltage which is received by a level-shifting circuit 42 that shifts voltage levels of the differential signal voltage to generate the folded and level-shifted differential output voltage at the differential output port 44.

The multiplication factor of the current multipliers 30 is preferably increased to a value that insures that substantially all of the signal current of the voltage-to-current converter 22 is diverted from its active components to issue instead from its passive components and flow differentially through the current paths 34 and 35 to thereby enhance the folding amplifier's linearity and gain stability.

Figure 2:
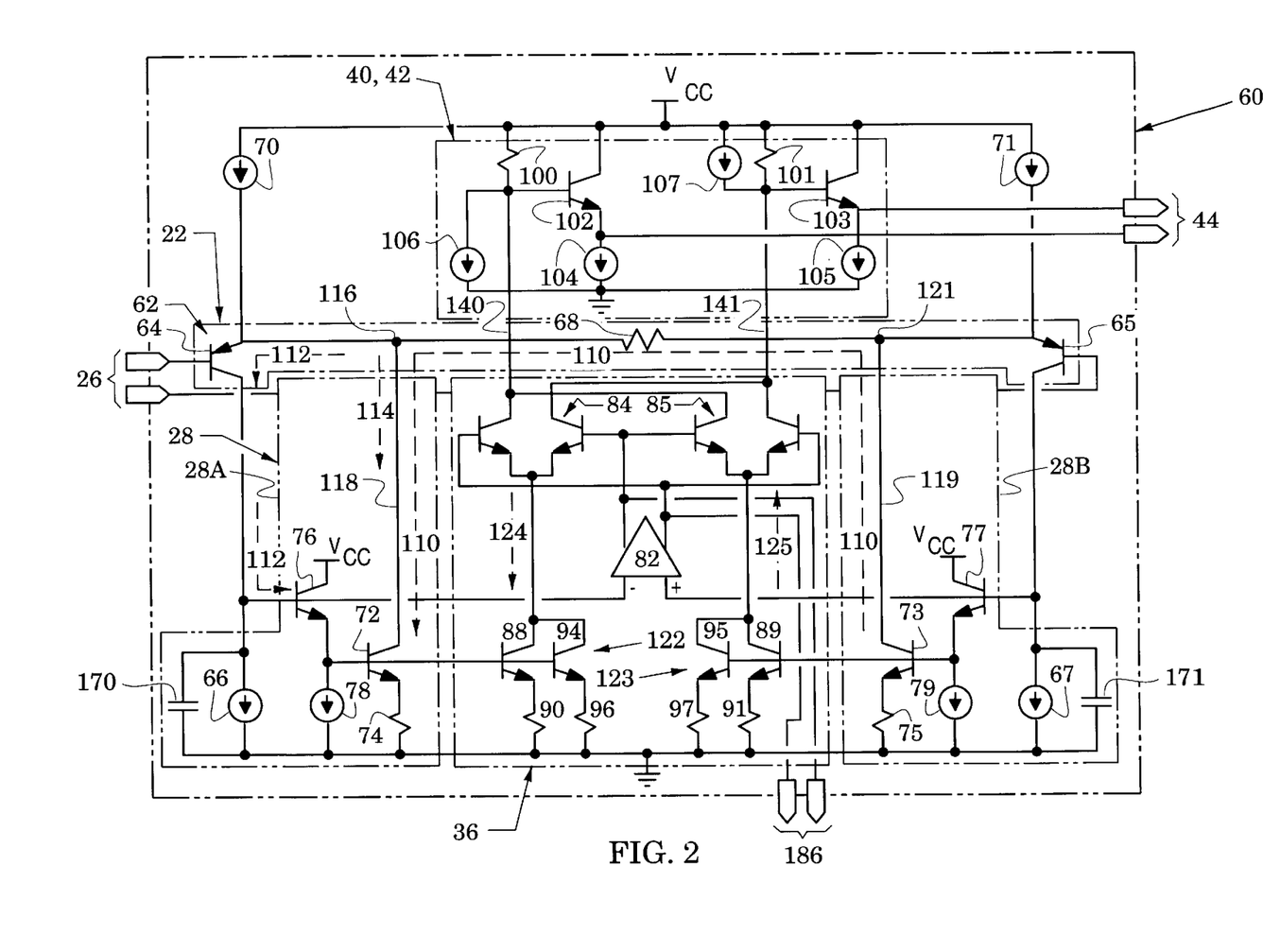
FIG. 2 is a schematic of an embodiment of the folding amplifier of FIG. 1.

A further study of this enhancement is facilitated by preceding it with a description of the folding amplifier embodiment 60 of FIG. 2. In this embodiment, the voltage-to-current converter 22 comprises an input differential pair 62 of transistors 64 and 65 that have bases coupled to the differential input port 26 and have emitters coupled together by a degeneration resistor 66. The emitters are also respectively coupled to a supply voltage $V_{CC}$ by current sources 70 and 71. In the embodiment 60, the current-feedback circuit 28 is shown in two portions 28A and 28B which couple the collectors of the input differential pair 62 to ground with respective current sources 66 and 67. The portions 28A and 28B also respectively include feedback transistors 72 and 73 whose collectors are connected to opposite sides of the degeneration resistor 66 and whose emitters are coupled to ground by emitter resistors 74 and 75. The bases of the transistors 72 and 73 respond to collector currents of the differential pair 62. In particular, feedback transistors 76 and 77 have bases connected to the collectors of the differential pair 62, collectors connected to a supply voltage $V_{CC}$ and emitters connected to bases of the feedback transistors 72 and 73 and also coupled to ground through current sources 78 and 79.

In the embodiment of FIG. 2, the current-steering network 36 has a comparator 82 and first and second differential pairs 84 and 85 of transistors. Differential inputs of the comparator respond to the collectors of the differential pair 62 of the voltage-to-current converter 22. The bases of the first and second differential pairs 84 and 85 are complimentarily and differentially connected to the differential output of the comparator 82 and collectors of the first and second differential pairs 84 and 85 are cross coupled.

Emitters of transistors 88 and 89 are respectively coupled to ground through resistors 90 and 91, their collectors are respectively connected to joined emitters of the first and second differential pairs 84 and 85 and their bases are respectively coupled to the bases of transistors 72 and 73. Similarly, emitters of transistors 94 and 95 are respectively coupled to ground through resistors 96 and 97, their collectors are respectively connected to joined emitters of the first and second differential pairs 84 and 85 and their bases are respectively coupled to the bases of transistors 72 and 73.

The current-to-voltage converter 40 of the embodiment 60 includes resistors 100 and 101 that are connected between the supply voltage $V_{CC}$ and the cross-coupled collectors of the first and second differential pairs 84 and 85. These resistors are coupled to the differential output port 44 by emitter followers 102 and 103 whose emitters are coupled to ground through current sources 104 and 105. The level-shifting circuit 42 is completed with current sources 106 and 107 whose currents are oppositely directed to the junctions between resistors 100 and 101 and respective bases of the emitter followers 102 and 103.

In operation of the folding amplifier 60, the differential input voltage at the differential input port 26 generates a signal current 110 through the degeneration resistor 68. For descriptive purposes, it is assumed in FIG. 2 that this current flows towards transistor 64 (in contrast to flowing towards transistor 65) and that a sense portion 112 of this current flows through transistor 64 and into transistor 76. A current multiplier (30 in FIG. 1) is formed by feedback transistors 76 and 72 which are coupled in a high gain common-collector-common-emitter arrangement (similar to a Darlington arrangement). For further descriptive purposes, it may be assumed that each of these transistors has a current gain $\beta$ of 100 so that the approximate current gain $\beta^2$ of the arrangement is on the order of 10,000.

In response to the sense current 112, the transistor 72 generates a feedback current 114 that flows out of the signal node 116 between transistor 64 and the degeneration resistor 68. At this signal node, the sum of the sense current 112 and the feedback current 114 equal the signal current 110 and because the feedback current 114 is ~10,000 times the sense current 112, substantially all of the signal current 110 is diverted from transistor 64 to flow along a first current path 118 that connects the signal node 116 and the collector of transistor 72.

A similar relationship of sense and feedback currents is associated with transistor 65 and a signal node 120 so that substantially all of the signal current 110 is also diverted from transistor 65 to flow along a second current path 119 that connects the collector of transistor 73 and the signal node 121.

Current sources 70 and 66 are configured so that the current of current source 70 exceeds that of current source 66 by an excess current. It is apparent from the magnitude relationship between the sense current 112 and the feedback current 114 that was described above, that substantially all of the excess current also flows along the current path 118 and through the emitter resistor 74 to thereby set the voltage levels of the bases of feedback transistors 72 and 76. A similar current relationship is associated with current sources 71 and 67 and emitter resistor 75.

In the absence of a differential input voltage, the voltage drop across resistors 74 and 75 are substantially equal so that the voltages at the bases of transistors 76 and 77 are also substantially equal. The latter voltages form the input signals to the comparator 82. When the signal current 110 (or an oppositely-directed current) flows in response to a differential input voltage at the differential input port 26, the differential voltage drops across resistors 74 and 75 are communicated through base-emitter junctions of transistors 72, 76 and 73, 77 to the inputs of the comparator 82.

Transistors 88 and 94 and resistors 90 and 96 form a current mirror 122 with transistor 72 and resistor 74 so that the signal current 110 is mirrored to be a mirror current 124 that flows away from the first differential pair 84. Similarly, transistors 89 and 95 and resistors 91 and 97 form a current mirror 123 with transistor 73 and resistor 75 so that the signal current 110 is mirrored to be a mirror current 125 that flows towards the second differential pair 85.

The first and second differential pairs 84 and 85 are coupled to the current-to-voltage converter 40 by current paths 140 and 141. Currents on the current paths 140 and 141 respectively flow across resistors 100 and 101 and develop differential voltages that are communicated to the differential output port 44 by the emitter followers 102 and 103.

Figure 3A:
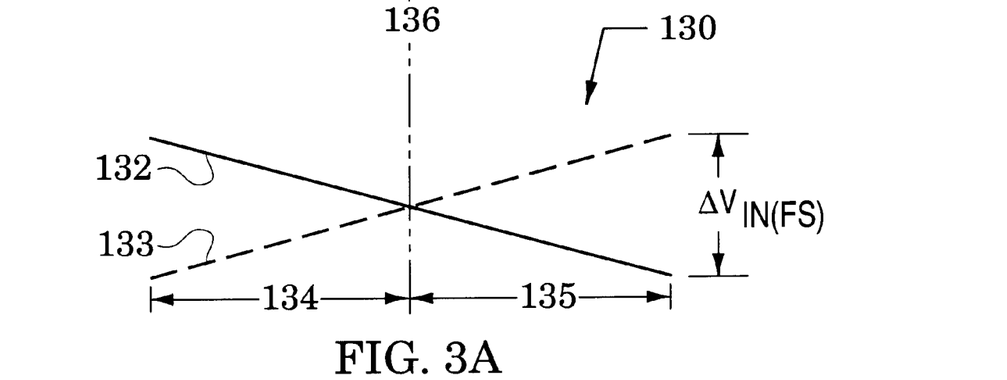
FIGS. 3A–3C are graphs of input and output signal continuums in the folding amplifier of FIG. 2.

To facilitate further operational description, it is helpful to address the polarity of the differential input voltage and divide it into two regions. Accordingly, the graph 130 of FIG. 3A illustrates a continuum of differential input voltages that can be applied at the input port 26 of FIG. 2 with input voltages 132 and 133 respectively applied at the bases of transistors 64 and 65 (to enhance visual clarity, voltage 133 is shown with a broken line).

In a first polarity region 134, the input voltage 130 is greater than the input voltage 131 and in a second polarity region 135, the input voltage 131 is greater than the input voltage 130. Only at a polarity transition 136, are the input voltages 130 and 131 equal. In response to the comparator 82, the first and second differential pairs 84 and 85 will therefore respectively steer mirrored versions (currents 124 and 125) of the currents on current paths 118 and 119 respectively to the current paths 141 and 140 when the input voltage is in the polarity region 134 and respectively steer them to current paths 140 and 141 when the input voltage is in the polarity region 135.

Thus, the folding amplifier will have a positive gain for input signals in polarity region 134 and negative gain for input signals in polarity region 135. If it is further assumed for descriptive purposes that the folding amplifier 60 is set to a gain of two and that the currents of the current sources 106 and 107 are temporarily set to zero, the differential output voltage at the emitter of transistor 103 will follow the plot 152 of graph 150 of FIG. 3B and the differential output voltage at the emitter of transistor 102 will follow the plot 153.

Thus the current-steering network 36 facilitates the folding process of the folding amplifier 60. The level-shifting process of the amplifier is realized by adjusting the amplitude of the current sources 106 and 107 so that they develop level-shifting voltages across the resistors 100 and 101 sufficient to shift the plots 152 and 153 of FIG. 3B to the shifted positions 152S and 153S of the graph 160 of FIG. 3C.

The plots 152S and 153S indicate the continuum of output voltages at the output port 44 that are generated in response to the continuum of input voltages of FIG. 3A. At the shifted positions of FIG. 3C, they cross each other at the midpoints of polarity regions 134 and 135 of FIG. 3A. Because the plots 152S and 153S therefore form a pattern similar to that of FIG. 3A for each of the polarity regions 134 and 135, they are suitable for quantization into a subsequent bit by a successive folding amplifier whose input port is coupled to the output port 44 of FIG. 2.

The base-emitter voltage $V_{BE}$ of each of the input transistors 64 and 65 of FIG. 2 is related to its collector current $I_C$ by the well-known relationship of $$V_{BE} = V_T \ln \frac{I_C}{I_S} \tag{1}$$

in which $V_T$ is a thermal constant and $I_S$ is a constant associated with transfer characteristics in the transistors' forward-active regions. If the current-feedback circuit 28 were removed from the folding amplifier 60, all of the signal current $I_{SIGN}$ (current 110) would flow through the base-emitter junctions of transistors 64 and 65 and would substantially equal their collector currents $I_C$ so that equation (1) becomes $$V_{BE} \approx V_T \ln \frac{I_{SIGN}}{I_S}. \tag{2}$$

Equation (2) indicates a nonlinear logarithmic relationship between the signal current 110 and the base-emitter voltages of the transistors of the differential pair 62.

Various references (e.g., Pederson, Donald O., et al., *Analog Integrated Circuits for Communication: Principles, Simulation and Design*, Kluwer Academic Publishers, Boston, 1991, pp. 72–75), have shown that this nonlinear relationship generates a current error in differential pairs so that the signal current 110 has a nonlinear relationship with the differential input voltage at the differential input port 26. Accordingly, removal of the current-feedback circuit 28 would introduce output waveform errors in the output continuum as indicated by the broken-line nonlinearity curves 166 and 167 of FIGS. 3B and 3C. Conversely, these errors are substantially eliminated by the presence of the current-feedback circuit 28 because it substantially diverts the current 110 from the input differential pair 62.

Bandwidth and stability of this closed-loop system are controlled in accordance with standard feedback techniques with capacitors 170 and 171 that respectively parallel current sources 66 and 67.

To preserve transfer-function linearity in the folding amplifier 60, the amplitude of the steered currents should not be altered as they are processed through the current-steering network 36. It is noted, however, that the first and second differential pairs 84 and 85 contribute an emitter-to-collector current gain α to the steered currents.

Figure 4:
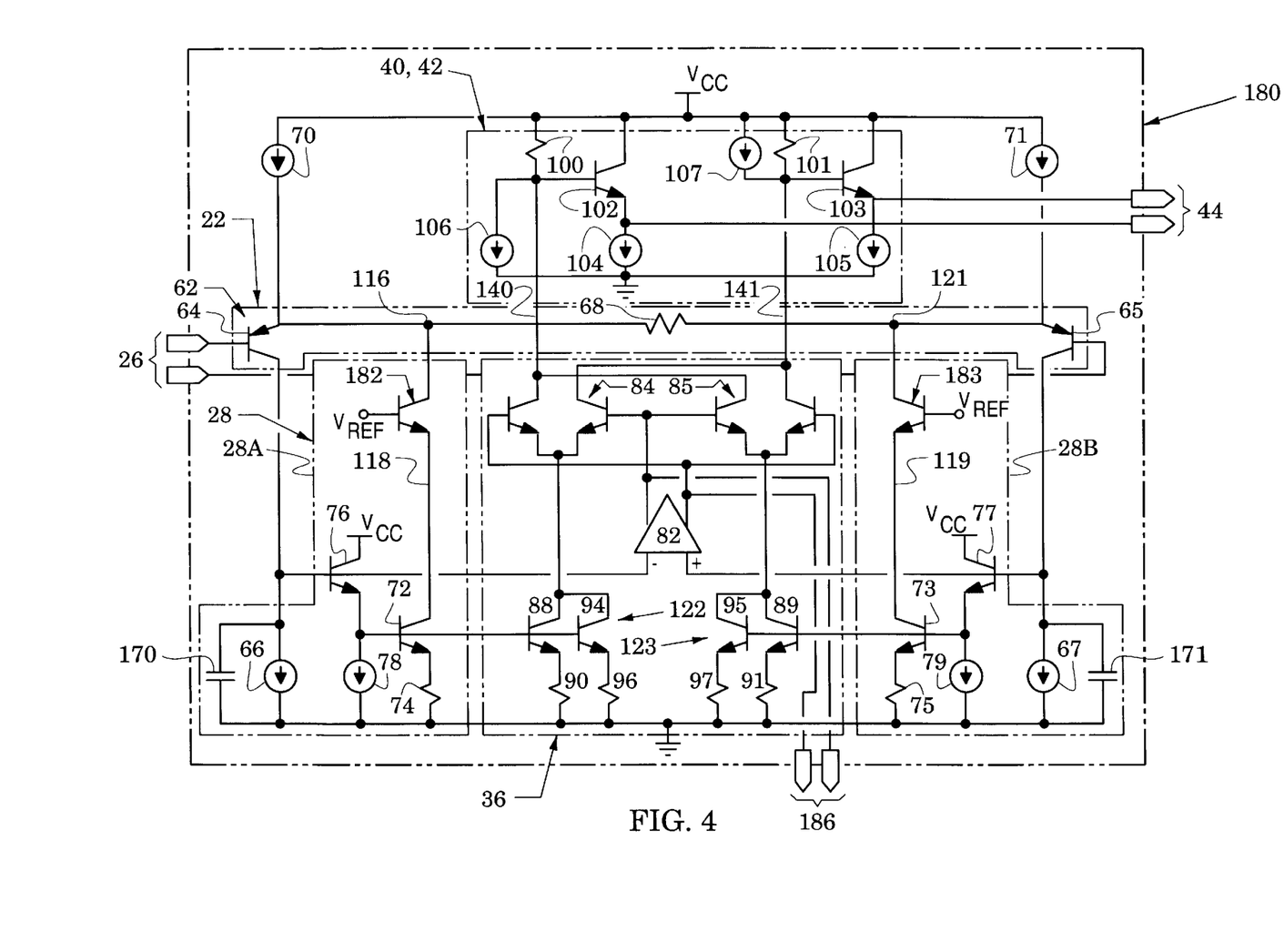
FIG. 4 is a schematic of another embodiment of the folding amplifier of FIG. 1.

Accordingly, FIG. 4 illustrates a folding amplifier 180 that is structured to cancel this current gain and further enhance the linearity of the invention's structures and methods. This folding amplifier is substantially similar to the folding amplifier 60 with like elements indicated by like reference numbers. In contrast, however, it respectively inserts compensation transistors 182 and 183 into the current paths 118 and 119 so that they introduce a collector-to-emitter current loss (X that cancels (i.e., compensates for) the current gain of the first and second differential pairs 84 and 85. To fully realize the α cancellation, the transistors 182 and 183 and the transistors of the first and second differential pairs 84 and 85 should be fabricated with devices of like size.

Folding amplifiers of the invention can be adjusted to facilitate the selection of various signal gains. In the folding amplifier 60 of FIG. 2, it is observed that the input differential voltage is substantially expressed by a product of the signal current 110 and the resistance of the degeneration resistor 68 and that the output differential voltage is substantially given by a product of the resistance sum of resistors 100 and 101 and mirrored versions of the signal current 110. Thus, the folding amplifier's gain $G_{FA}$ is given by multiplying the quantity $(R_{100}+R_{101})/R_{68}$ by the current gain of the current mirrors 124 and 125.

As an example of the current mirror gain, the mirrored versions are the mirror currents 124 and 125 in which the current mirrors 122 and 123 have been configured with dual transistors and dual resistors as exemplified by transistors 88 and 94 and resistors 90 and 96. If transistors 88 and 94 are made identical to transistor 72 and resistors 74, 90 and 96 have the same resistance, the mirrored currents 124 and 125 are twice the signal current 110 and the current mirror gain is two.

From this example, it is apparent that the signal gain of the folding amplifier 60 is set by relationships of resistances. Because resistance ratios can be closely maintained in integrated circuit fabrication, the above-described structures permit a selected gain to be held substantially constant from production unit to unit.

Folding amplifiers are typically used in N-stage serial ADC arrangements in which the differential output voltage (at the differential output port 44 of FIG. 2) of one stage is the differential input voltage (at the differential input port 26 of FIG. 2) of a successive stage. In these arrangements, the nonlinearities represented by the curves 166 and 167 progressively degrade the input voltages of successive stages and, as a result, quantization errors are introduced which limit the number N of stages that can be reliably used. Because of the invention's linear operation, these stage limitations are substantially reduced. In particular, the gain linearity and stability of the invention's folding amplifiers enhance their use in compound ADCs as exemplified in the ADCs of FIGS. 5 and 6.

In these applications, each folding amplifier stage generates a differential output signal that digitally indicates the signal quantization of that stage. This differential signal can be derived in various arrangements of the voltage-to-current converter 22 of FIGS. 2 and 4. An exemplary arrangement is shown in these figures in which the differential input signal of the comparator 82 is simply made available at a bit output port 186.

Figure 5:
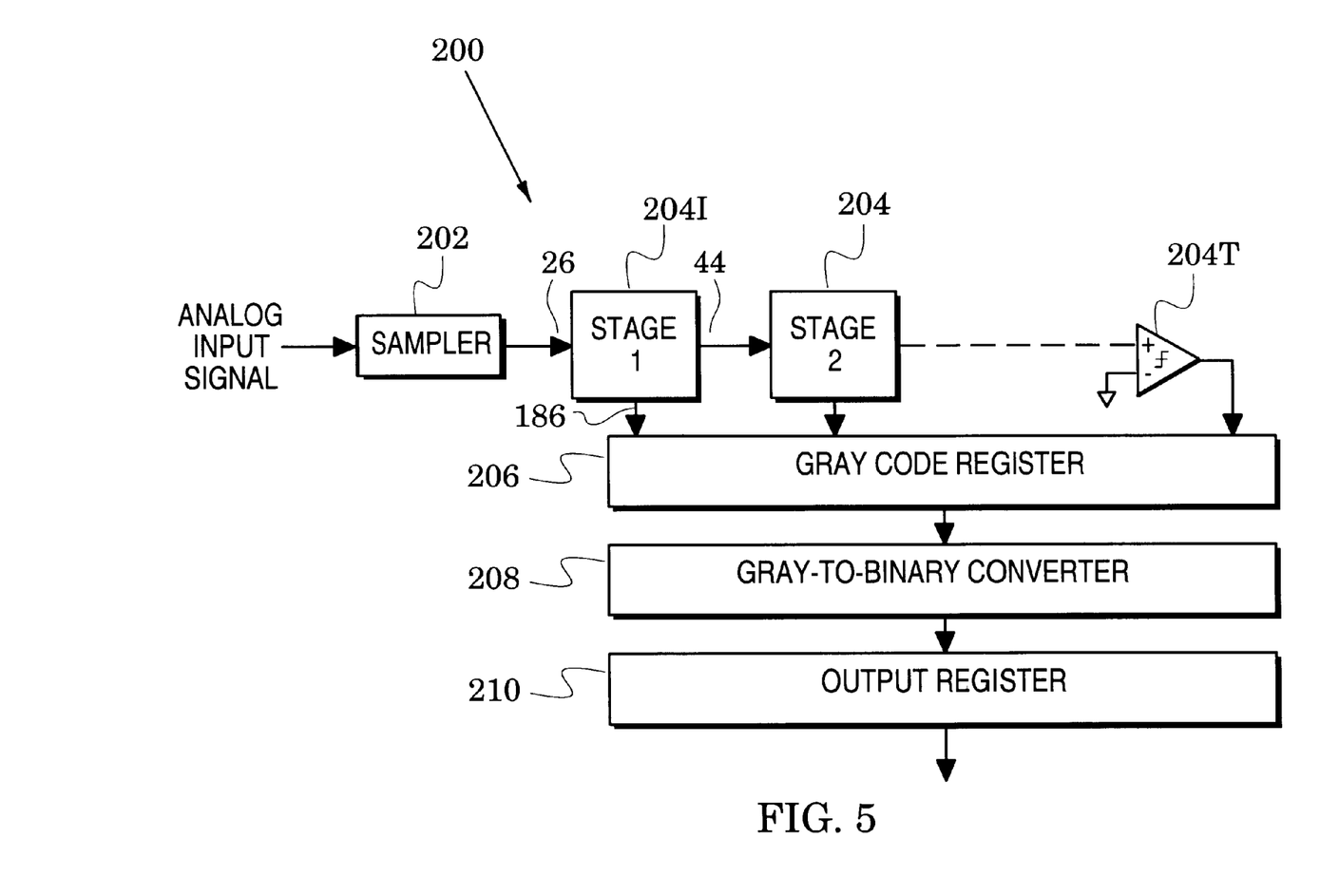
FIG. 5 is a block diagram of a series ADC that includes the folding amplifier of FIG. 1.

Attention is now directed to FIG. 5 which illustrates a serial ADC 200 that receives an analog signal with a sampler 202 (e.g., a sample and hold circuit) that feeds N serially-connected single-bit ADC stages 204. Because no further signal processing is needed after a terminal quantization, a terminal stage 204T is a simple comparator.

At least an initial one 204I of the remaining stages, however, is formed with the folding amplifier 20 of FIG. 1. Each of these initial stages receives a differential input at its input port 26 and delivers a folded and level-shifted output at its output port 44. Each stage also outputs a bit signal at its bit output 186.

Figure 3B:
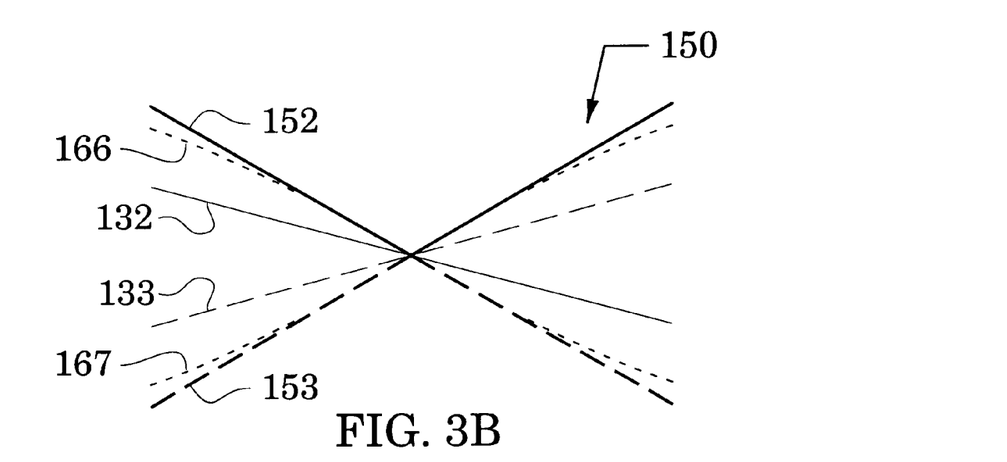
Figure 3C:
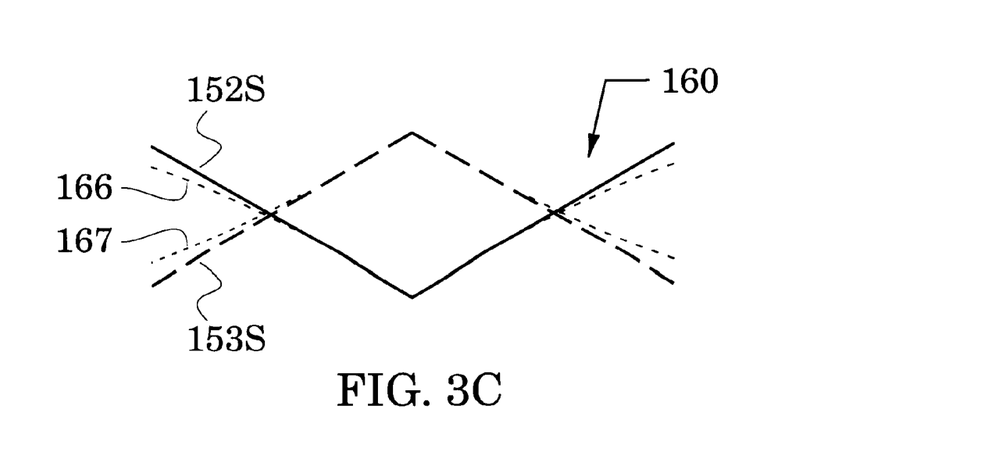

Because of their folding process (e.g., as shown in FIG. 3B), folding amplifiers reverse the order of every other set of digital output bits so that they provide a Gray code rather than a binary code. Accordingly, the output bits of the ADC stages of FIG. 5 are initially collected in a Gray code register 206 and then preferably converted in a Gray-to-binary converter 208 before passing through an output register 209.

Because of their speed, simplicity and efficiency, unity-gain folding amplifiers (e.g., as shown in U.S. Pat. No. 5,550,492) are preferably used for the remaining stages 204. The folding process, however, causes each of these unity-gain amplifiers to halve its input signal range and pass that reduced signal range to its successive folding amplifier. For large values of N, this halving of the input signal range will reduce it below a level that can be reliably quantized. Reliable quantization of successive stages is also jeopardized by nonlinear processes of preceding stages (e.g., as exemplified by nonlinearity curves 166 and 167 of FIG. 3C).

Accordingly, the folding amplifier 20 of FIG. 1 is especially suited for use as the initial stage 204I because its gain-setting resistors can be chosen as described above to realize a gain that is sufficient to provide the terminal stage 204T with an input signal range that can be reliably quantized. In addition, the current feedback of the folding amplifier 20 insures that its gain is linear and stable.

Figure 6:
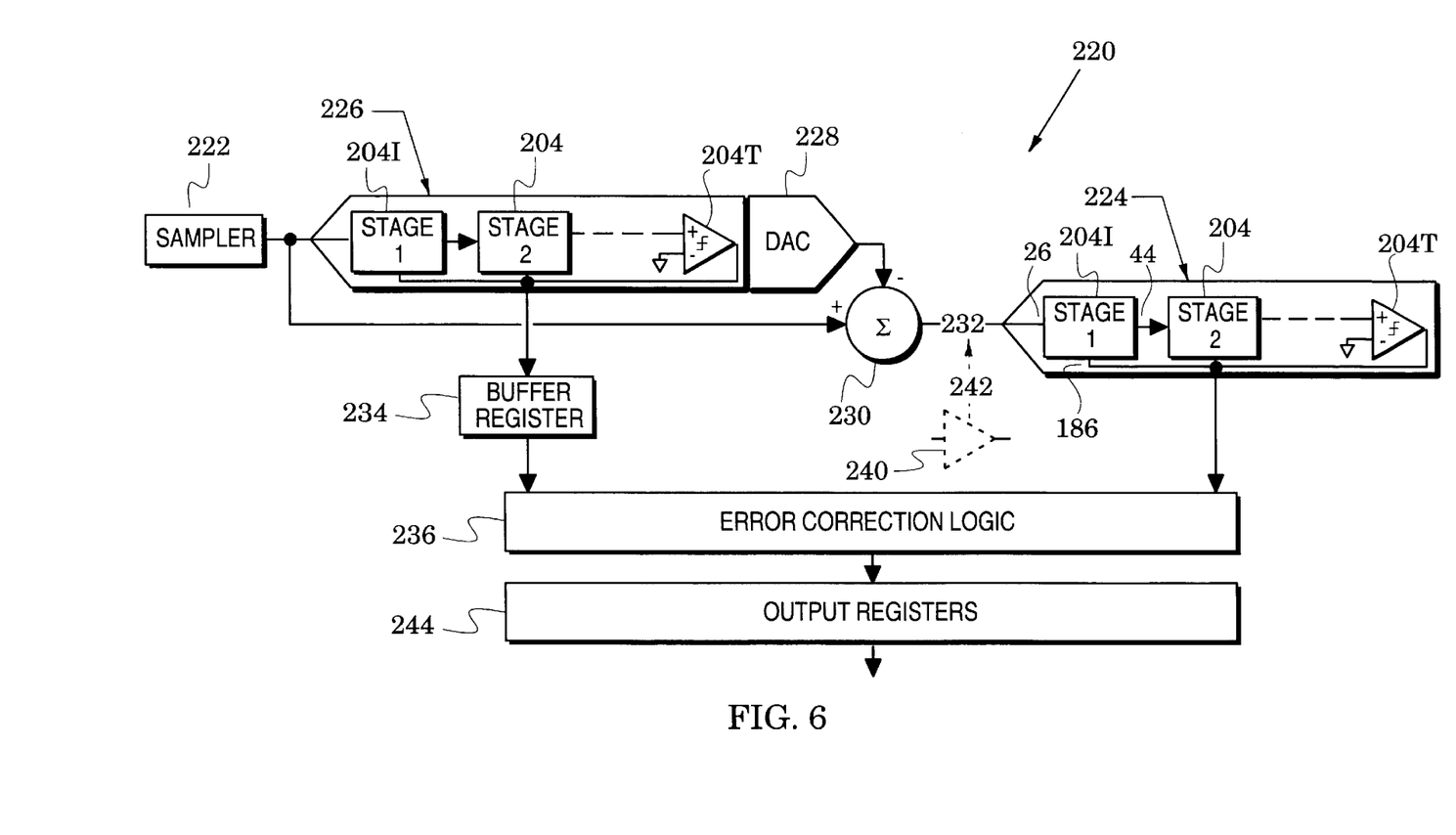
FIG. 6 is a block diagram of a subranging ADC that includes the folding amplifier of FIG. 1.

FIG. 6 illustrates a K-stage subranging ADC 220 that includes a sampler 222 and a terminal N-stage serial ADC 224 that is preceded by an M-stage serial ADC 226. The digital output of the serial ADC 226 is coupled through a matching M-stage DAC 228 whose analog output is subtracted in a subtracter 230 from the output of the sampler to form a residue signal 232 which is quantized by the serial ADC 224. The converted bits from the serial ADC 226 are preferably held in buffer registers 234 before all converted bits are collected in output registers 236.

The serial ADCs 224 and 226 have N and M stages respectively and, similar to the serial ADC 200 of FIG. 5, these are referenced as stages 204 with a terminal stage 204T in each ADC being a simple comparator. Similar to the serial ADC 200 of FIG. 5, unity-gain folding amplifiers are preferably used for the remaining stages 204 of the serial ADC 226 unless that reduces input signal ranges below a level that can be reliably quantized. If this is the case, the folding amplifier 20 of FIG. 1 should be substituted for the initial stage 204I and set for a low gain, e.g., a gain of 2.

Unity-gain folding amplifiers are also preferably used for most of the stages that precede the terminal stage 204T of the terminal serial ADC 224. Because these stages continue to halve the input signal range that has already been reduced by successive stages of the serial ADC 226, subranging ADC structures have conventionally inserted a high-linearity high-frequency residue amplifier 240 as indicated by the broken insertion arrow 242 to amplify the residue signal 232. This amplifier typically restores the input signal range for the serial ADC 224 to a level that equals or approximates that provided to the preceding serial ADC 226.

To insure reliable operation of the serial ADC 224, the amplifier 240 must have linear and stable gain that is repeatable from production unit to unit. Because these parameters also characterize the invention's adjustable-gain folding amplifiers, the amplifier 240 can be eliminated by using the folding amplifier 20 of FIG. 1 for the initial stage 204I and setting its gain to that of the replaced amplifier. This stage receives a differential input at its input port 26, delivers a folded and level-shifted output at its output port 44 and generates a bit signal at its bit output 186.

A single folding amplifier 20 thus performs the amplification functions of the residue amplifier 240 and the quantization, folding and level-shifting functions of the initial ADC stage 204I. This replacement in the subranging ADC 220 reduces its complexity and power dissipation while maintaining its accuracy and speed.

Although the K-stage subranging ADC 220 can be configured to generate M+N=K bits from the M-stage serial ADC 226 and N-stage serial ADC 224, this places severe demands on the accuracy and settling time of the preceding ADC 226. These demands are relaxed and overall speed increased by generating K−1 bits which facilitates a digital error correction process.

In an exemplary arrangement, the N-stage serial ADC 224 includes an extra stage. The A/D and D/A conversions of the serial ADC 226 and DAC 228 may then be performed more quickly but with some loss of accuracy because of inadequate settling time. The higher resolution of the serial ADC 224 contains enough data to correct the errors in the initial conversion process and this correction is typically accomplished in a full adder that can be included in an error correction logic 244. Although this arrangement requires a small increase in hardware complexity, it facilitates a significant increase in speed and accuracy.

To further enhance operation of the subranging ADC 220, additional samplers are typically inserted in the analog paths before and after the subtracter 230. The structure of the subranging ADC 220 can be extended with additional preceding ADCs. That is, another serial ADC and matching DAC can be arranged to feed a residue signal to the serial ADC 226 in the same manner that this ADC generates and feeds a residue signal to the serial ADC 224.

With reference to the folding amplifier 60 of FIG. 2, it was previously stated that current sources 106 and 107 generate currents that are oppositely directed to the junctions between resistors 100 and 101 and respective bases of the emitter followers 102 and 103. Because the linear gain of the folding amplifier 60 is controlled with resistance ratios, the currents required from these level-shifting current sources are easily calculated with knowledge of the full-scale input voltage range $\Delta V_{IN(FS)}$ (shown in FIG. 3A) and the folding amplifier's gain $G_{FA}$. In the example of the folding amplifier 60 of FIG. 2, this gain was previously found by multiplying the quantity $(R_{100}+R_{101})/R_{68}$ by the current gain of the current mirrors 124 and 125. For the folding amplifier 60, the current $I_{CS}$ of each of the current sources 106 and 107 is then given by $$I_{CS} = \frac{\Delta V_{IN(FS)} G_{FA}}{2(R_{100} + R_{101})}. \quad (3)$$

Although the invention has been described with reference to specific polarities of bipolar transistors, the teachings of the invention may be practiced with different polarities and, more generally, may be practiced with any transistors that have first and second current terminals (e.g., emitters and collectors) that are responsive to control terminals (e.g., bases).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A folding amplifier that generates a folded and level-shifted differential output voltage in linear response to a differential input voltage, comprising:

a voltage-to-current converter that includes active components which are arranged to generate a signal current that substantially corresponds to said differential input voltage;

a current-feedback circuit that diverts said signal current from said active components to flow differentially through first and second current paths and thereby enhance the linearity of said voltage-to-current converter;

a current-steering network that steers currents on said first and second current paths to third and fourth current paths respectively when said input signal has one polarity and to said fourth and third current paths respectively when said input signal has a different polarity;

a current-to-voltage converter that generates a differential signal voltage in response to currents on said third and fourth current paths; and a level-shifting circuit that shifts voltage levels of said differential signal voltage to generate said differential output voltage.

2. The folding amplifier of claim 1, wherein:

said active components include an input differential pair of transistors that each have first and second current terminals responsive to a control terminal that is coupled to one side of said differential input voltage;

said passive components include a resistor coupled between the first current terminals of said input differential pair; and said current-feedback circuit receives a differential sense current from second current terminals of said input pair, amplifies said differential sense current to a differential feedback current and couples said differential feedback current to the first current terminals of said input pair.

3. The folding amplifier of claim 2, wherein:

said current-feedback circuit includes first and second feedback transistors that each have first and second current terminals responsive to a control terminal;

the control terminals of said first and second feedback transistors are coupled to receive said sense current from the second current terminals of said input pair; and the second current terminals of said first and second feedback transistors are coupled to deliver said feedback current to the first current terminals of said input pair.

4. The folding amplifier of claim 1, wherein:

said current-steering network includes first and second differential pairs of steering transistors that each have first and second current terminals responsive to a control terminal;

the first current terminals of said first and second differential pairs are respectively coupled to said first and second current paths;

the second current terminals of said first and second differential pairs are cross-coupled to said third and fourth current paths; and the control terminals of said first and second differential pairs are coupled to complimentarily and differentially respond to said differential input voltage.

5. The folding amplifier of claim 4, wherein said current-steering network further includes a comparator-having a differential input coupled to receive said differential input voltage and a differential output coupled to the control terminals of said first and second differential pairs.

6. The folding amplifier of claim 4, wherein said current-steering network further includes first and second current-mirrors that respectively mirror said signal current from said first and second current paths to the first current terminals of said first and second differential pairs.

7. The folding amplifier of claim 4, wherein said current-steering network further includes first and second compensation transistors that are respectively coupled to carry said signal current along said first and second current paths to thereby compensate for current differentials in said steering transistors.

8. The folding amplifier of claim 1, wherein said current-to-voltage converter includes first and second output resistors that are respectively coupled to said third and fourth current paths.

9. The folding amplifier of claim 1, wherein said level-shifting network includes first and second output current sources that direct first and second output currents in opposite directions through said first and second output resistors.

10. The folding amplifier of claim 9, wherein:
    said current-to-voltage converter further includes first and second output transistors that each have first and second current terminals responsive to a control terminal;
    the control terminals of said first and second output transistors are coupled to said third and fourth current paths; and
    said differential output voltage is supplied at the first current terminals of said first and second output transistors.

11. A method for generating a folded and level-shifted differential output voltage in linear response to a differential input voltage, the method comprising the steps of:
    with circuit components that include active components, converting said differential input voltage to a signal current;
    diverting substantially all of said signal current from said active components to flow differentially through first and second current paths;
    steering currents on said first and second current paths to third and fourth current paths respectively when said input signal has one polarity and to said fourth and third current paths respectively when said input signal has a different polarity;
    converting currents on said third and fourth current paths to a differential signal voltage; and
    shifting voltage levels of said differential signal voltage to thereby generate said differential output voltage;
    the linear response and the folded and level-shifted attributes of said differential output voltage respectively facilitated by said diverting, steering and shifting steps.

12. The method of claim 11, wherein said diverting step includes the steps of:
    receiving differential currents from said active components;
    amplifying said differential currents with a current gain to realize amplified differential currents; and
    directing said amplified differential currents differentially along said first and second current paths.

13. The method of claim 12, wherein said current gain is substantially 100.

14. The method of claim 12, wherein said current gain is substantially 10,000.

15. The method of claim 12, wherein said active components are bipolar transistors.

16. A serial analog-to-digital converter, comprising:
    a sampler;
    a comparator;
    at least one folding amplifier coupled between said sampler and said comparator in a serial arrangement wherein each folding amplifier generates a folded and level-shifted differential output voltage in linear response to a differential input voltage and at least one folding amplifier includes:
        a) a voltage-to-current converter that includes active component s which are arranged to generate a signal current that substantially corresponds to said differential input voltage;
        b) a current-feedback circuit that diverts said signal current from said active components to flow differentially through first and second current paths and thereby enhance the linearity of said voltage-to-current converter;
        c) a current-steering network that steers currents on said first and second current paths to third and fourth current paths respectively when said input signal has one polarity and to said fourth and third current paths respectively when said input signal has a different polarity;
        d) a current-to-voltage converter that generates a differential signal voltage in response to currents on said third and fourth current paths; and
        e) a level-shifting circuit that shifts voltage levels of said differential signal voltage to generate said differential output voltage;
    and
    a gray code register that responds to the second differential input voltage of said folding amplifier and to said comparator.

17. The serial analog-to-digital converter of claim 16, further including: a gray-to-binary converter responsive to said gray-code register; and an output register responsive to said gray-to-binary converter.

18. The serial analog-to-digital converter of claim 16, wherein:
    said active components include an input differential pair of transistors that each have first and second current terminals responsive to a control terminal that is coupled to one side of said differential input voltage;
    said passive components include a resistor coupled between the first current terminals of said input differential pair; and
    said current-feedback circuit receives a differential sense current from second current terminals of said input pair, amplifies said differential sense current to a differential feedback current and couples said differential feedback current to the first current terminals of said input pair.

19. A K-bit subranging analog-to-digital converter, comprising:
    a sampler;
    an M-bit serial analog-to-digital converter responsive to said sampler;
    an M-bit digital-to-analog converter responsive to said M-bit serial analog-to-digital converter;
    a subtracter that responds to said sampler and to said M-bit serial analog-to-digital converter and provides a residue signal;
    an N-bit serial analog-to-digital converter responsive to said residue signal; and
    an output register;

wherein said N-bit serial analog-to-digital converter includes:
a) a sampler;
b) a comparator; and
c) at least one folding amplifier coupled between said sampler and said comparator in a serial arrangement wherein each folding amplifier generates a folded and level-shifted differential output voltage in linear response to a differential input voltage and at least one folding amplifier includes:
   a) a voltage-to-current converter that includes active components which are arranged to generate a signal current that substantially corresponds to said differential input voltage;
   b) a current-feedback circuit that diverts said signal current from said active components to flow differentially through first and second current paths and thereby enhance the linearity of said voltage-to-current converter;
   c) a current-steering network that steers currents on said first and second current paths to third and fourth current paths respectively when said input signal has one polarity and to said fourth and third current paths respectively when said input signal has a different polarity;
   d) a current-to-voltage converter that generates a differential signal voltage in response to currents on said third and fourth current paths; and
   e) a level-shifting circuit that shifts voltage levels of said differential signal voltage to generate said differential output voltage;

and wherein, for each of said M-bit serial analog-to-digital converter and said N-bit serial analog-to-digital converter, said output register responds to the second differential input voltage of said folding amplifier and to said comparator.

20. The subranging analog-to-digital converter of claim 19, wherein M+N>K and further including an error correction logic inserted before said output register.

21. The subranging analog-to-digital converter of claim 19, wherein:

said active components include an input differential pair of transistors that each have first and second current terminals responsive to a control terminal that is coupled to one side of said differential input voltage;

said passive components include a resistor coupled between the first current terminals of said input differential pair; and said current-feedback circuit receives a differential sense current from second current terminals of said input pair, amplifies said differential sense current to a differential feedback current and couples said differential feedback current to the first current terminals of said input pair.

\* \* \* \* \*